US008839509B2

(12) United States Patent
Kakimoto et al.

(10) Patent No.: US 8,839,509 B2
(45) Date of Patent: Sep. 23, 2014

(54) METHOD FOR MANUFACTURING ELECTRONIC APPARATUS

(75) Inventors: Noriyuki Kakimoto, Obu (JP); Masao Yamada, Kariya (JP)

(73) Assignee: DENSO CORPORATION, Kariya (JP)

( * ) Notice: Subject to any disclaimer, the term of this patent is extended or adjusted under 35 U.S.C. 154(b) by 173 days.

(21) Appl. No.: 13/596,188

(22) Filed: Aug. 28, 2012

(65) Prior Publication Data

US 2013/0047426 A1     Feb. 28, 2013

(30) Foreign Application Priority Data

Aug. 31, 2011   (JP) ................. 2011-189821

(51) Int. Cl.
| H05K 3/30 | (2006.01) |
| H01L 23/00 | (2006.01) |
| H05K 7/14 | (2006.01) |
| H01L 23/498 | (2006.01) |
| H01L 23/495 | (2006.01) |
| H01L 25/18 | (2006.01) |
| H01L 25/07 | (2006.01) |
| H01L 25/16 | (2006.01) |

(52) U.S. Cl.
CPC .... H05K 7/1432 (2013.01); H01L 2224/48137 (2013.01); H01L 2224/49113 (2013.01); H01L 2924/00014 (2013.01); H01L 24/49 (2013.01); H01L 2924/13055 (2013.01); H01L 2224/49175 (2013.01); H01L 2224/49111 (2013.01); H01L 25/16 (2013.01); H01L 23/49844 (2013.01); H01L 23/49575 (2013.01); H01L 2224/48227 (2013.01); H01L 25/18 (2013.01); H01L 23/49562 (2013.01); H01L 25/072 (2013.01); H01L 2224/48472 (2013.01); H01L 2224/48091 (2013.01)

USPC ................ 29/831; 29/841; 29/846; 29/854; 29/855; 29/858; 180/65.21; 361/689; 363/17; 363/98; 363/132; 363/137; 363/144; 307/147; 307/148

(58) Field of Classification Search
USPC ........... 29/825, 831, 841, 846, 854, 855, 858, 29/883; 180/65.21; 307/147, 148; 361/689; 363/17, 98, 132, 137, 144
See application file for complete search history.

(56) References Cited

U.S. PATENT DOCUMENTS

| 6,327,165 B1 * | 12/2001 | Yamane et al. ................. 363/132 |
| 6,525,950 B1 | 2/2003 | Shirakawa et al. |
| 6,791,854 B2 * | 9/2004 | Shirakawa et al. ............. 363/147 |
| 6,843,335 B2 * | 1/2005 | Shirakawa et al. ........... 180/65.1 |

(Continued)

FOREIGN PATENT DOCUMENTS

| JP | A-07-24591 | 1/1995 |
| JP | A-07-303380 | 11/1995 |

(Continued)

*Primary Examiner* — Paul D Kim
(74) *Attorney, Agent, or Firm* — Posz Law Group, PLC (57) ABSTRACT

Multiple high-voltage side and low-voltage side electric conductors are formed from one sheet of a conductive plate in such a way that the multiple electric conductors are arranged in parallel to one another across an initial gap between the high-voltage side and the low-voltage side electric conductors. The multiple electric conductors are connected to one another via connecting portions. An intermediate portion of the connecting portion is deformed so as to reduce the initial gap to a smaller adjusted gap. Portions of the electric conductors as well as switching devices mounted to the electric conductors are sealed by sealing material. The connecting portions are cut away so that the electric conductors are finally separated from one another.

10 Claims, 9 Drawing Sheets

(56) References Cited

U.S. PATENT DOCUMENTS

| | | | |
|---|---|---|---|
| 7,542,317 B2* | 6/2009 | Azuma et al. | 363/131 |
| 7,869,193 B2* | 1/2011 | Nohara et al. | 361/624 |
| 8,376,069 B2* | 2/2013 | Nakatsu et al. | 180/65.21 |
| 2005/0024805 A1 | 2/2005 | Heilbronner et al. | |
| 2005/0161809 A1* | 7/2005 | Nakatsu et al. | 257/734 |
| 2007/0051974 A1 | 3/2007 | Azuma et al. | |

FOREIGN PATENT DOCUMENTS

| | | |
|---|---|---|
| JP | 2002-057282 A | 2/2002 |
| JP | A-2005-117728 | 4/2005 |
| JP | A-2005-237118 | 9/2005 |
| JP | A-2005-354864 | 12/2005 |
| JP | 2006-080300 A | 3/2006 |
| JP | A-2007-82359 | 3/2007 |
| JP | A-2010-251665 | 11/2010 |

\* cited by examiner

METHOD FOR MANUFACTURING ELECTRONIC APPARATUS

CROSS REFERENCE TO RELATED APPLICATION

This application is based on Japanese Patent Application No. 2011-189821 filed on Aug. 31, 2011, the disclosure of which is incorporated herein by reference.

TECHNICAL FIELD

The present disclosure relates to a method for manufacturing an electronic apparatus having high-voltage side electric conductors and low-voltage side electric conductors, wherein the high-voltage side and low-voltage side electric conductors are arranged in parallel to each other and sealed with sealing material.

BACKGROUND

It is known in the art to reduce parasitic inductance causing surge noise, which is generated in a switching operation of a power converting apparatus having switching elements. In a conventional power converting apparatus, a high-voltage side electric conductor (to which a high-voltage side switching element is mounted) and a low-voltage side electric conductor (to which a low-voltage side switching element is mounted) are arranged in parallel to each other and a distance between the high-voltage side and the low-voltage side electric conductors is made smaller so as to reduce the parasitic inductance, which may cause the surge noise.

A circuit arrangement is known in the art, for example, as disclosed in Japanese Patent Publication No. 2004-080993 (A), which corresponds to U.S. Pat. No. 7,227,259 B2. According to the circuit arrangement, DC port conductors are placed over their entire length in mutual close proximity and separated from each other only by an insulating layer, in order to achieve low parasitic inductances. In addition, substantial partial sectors of DC port conductors are arranged in close proximity to substrate and/or ribbon connectors.

According to another prior-art power converting apparatus, for example, as disclosed in Japanese Patent Publication No. 2001-286158, flow directions of electric currents are opposite to each other between a positive-side plate conductor and a negative-side plate conductor. The positive-side and the negative-side plate conductors are built up across an insulating sheet. Namely, the positive-side and the negative-side plate conductors are arranged close to but separated from each other by only a thickness of the insulating sheet. As a result, the plate conductors are formed in a low-inductance structure.

In a power converting apparatus having switching devices, it is necessary to make smaller a distance between a high-voltage side electric conductor and a low-voltage side electric conductor, in order to further reduce the parasitic inductance. However, in a case that the high-voltage side and the low-voltage side electric conductors are made from one sheet of a conductive plate, by a punching process using ordinary dies and punches, a distance between the electric conductors is limited to almost a thickness of the conductive plate. In other words, it is difficult to form a smaller distance, which is smaller than criteria of stable machining (for example, the thickness of the conductive plate).

It is possible to separately prepare the high-voltage side and the low-voltage side electric conductors and to arrange such electric conductors so that a distance between them is smaller than the thickness. It is, however, necessary to control such a small distance between the electric conductors over their entire length, which may cause an increase of a manufacturing cost.

It is required to reduce a distance between two electric conductors to a smaller value (which is smaller than a thickness of the electric conductors) not only in the power converting apparatus having switching devices but also in other electronic apparatuses, in which a high-voltage side bus bar (corresponding to the high-voltage side electric conductor) and a low-voltage side bus bar (corresponding to the low-voltage side electric conductor) are arranged in parallel to each other. However, in such an electronic apparatus, there is a problem which is the same to that for the above-explained power converting apparatus.

SUMMARY OF THE DISCLOSURE

The present disclosure is made in view of the above points. It is an object of the present disclosure to provide a method for manufacturing an electronic apparatus, according to which a high-voltage side and a low-voltage side electric conductors are made from one sheet of a conductive plate, wherein the high-voltage side and the low-voltage side electric conductors are arranged in parallel to each other and a distance between two electric conductors can be made smaller.

According to a feature of the present disclosure (for example, as defined in claim 1), a manufacturing method is applied to an electronic apparatus, which has a high-voltage side electric conductor and a low-voltage side electric conductor, wherein the high-voltage side and the low-voltage side electric conductors are arranged in parallel to each other and at least portions of the high-voltage side and the low-voltage side electric conductors are sealed by sealing material. The method for manufacturing the electronic apparatus has following steps:

a first step for preparing one sheet of a conductive plate for forming the high-voltage side and the low-voltage side electric conductors;

a second step for punching out the conductive plate, to thereby form the high-voltage side and the low-voltage side electric conductors as well as connecting portions, in such a manner that a side end of the high-voltage side electric conductor and a side end of the low-voltage side electric conductor are opposing to each other in an opposing direction so as to form a predetermined initial gap between the respective side ends of the high-voltage side and the low-voltage side electric conductors, and that the high-voltage side and the low-voltage side electric conductors are connected to each other via the connecting portions;

a third step for deforming a portion of the connecting portion, and/or deforming a portion of the high-voltage side or the low-voltage side electric conductor, so as to reduce the initial gap to a smaller gap;

a fourth step for sealing the portions of the high-voltage side and the low-voltage side electric conductors by the sealing material; and a fifth step for cutting away the connecting portions after the fourth step, so that the high-voltage side and the low-voltage side electric conductors are separated from each other.

According to the above features, the high-voltage side and the low-voltage side electric conductors are formed from one sheet of the conductive plate by the punching process so as to be arranged in parallel to each other across the predetermined gap, and the portion of the connecting portion for connecting the high-voltage side and the low-voltage side electric conductors is deformed. Alternatively, a portion of the high-voltage side or the low-voltage side electric conductor is deformed. As a result, the gap can be made smaller.

In other words, it is possible to make smaller the gap between the high-voltage side and the low-voltage side electric conductors (which are formed from one sheet of the conductive plate), without being influenced by criteria of stable machining for the punching process or the like.

BRIEF DESCRIPTION OF THE DRAWINGS

The above and other objects, features and advantages of the present disclosure will become more apparent from the following detailed description made with reference to the accompanying drawings. In the drawings:

FIGS. 10A and 10B are schematic explanatory views respectively showing portions of a step for manufacturing the power converting apparatus according to a third embodiment of the present disclosure, wherein

FIGS. 11A and 11B are schematic explanatory views respectively showing portions of a step for manufacturing the power converting apparatus according to a fourth embodiment of the present disclosure, wherein

DETAILED DESCRIPTION OF THE EMBODIMENTS

The present disclosure will be explained by way of multiple embodiments with reference to the drawings.
(First Embodiment)

Figure 1:
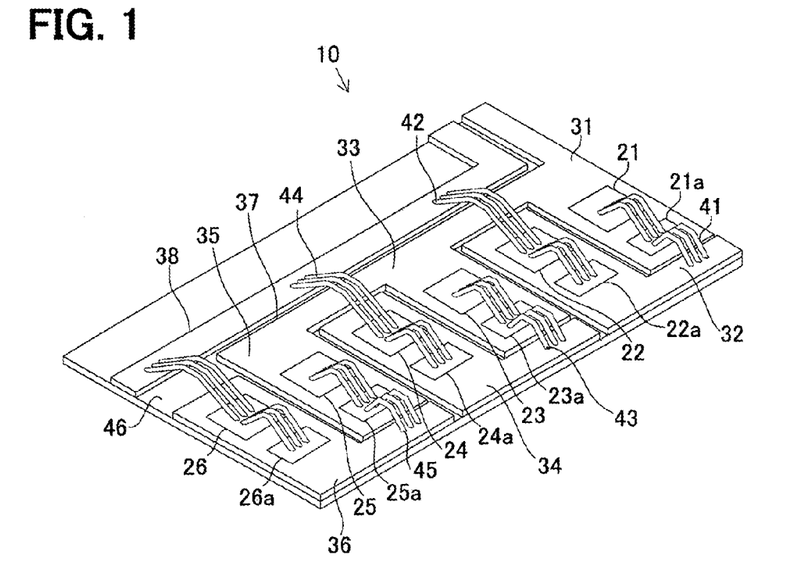
FIG. 1 is a schematic perspective view showing a relevant portion of a power converting apparatus according to a first embodiment of the present disclosure.
Figure 2:
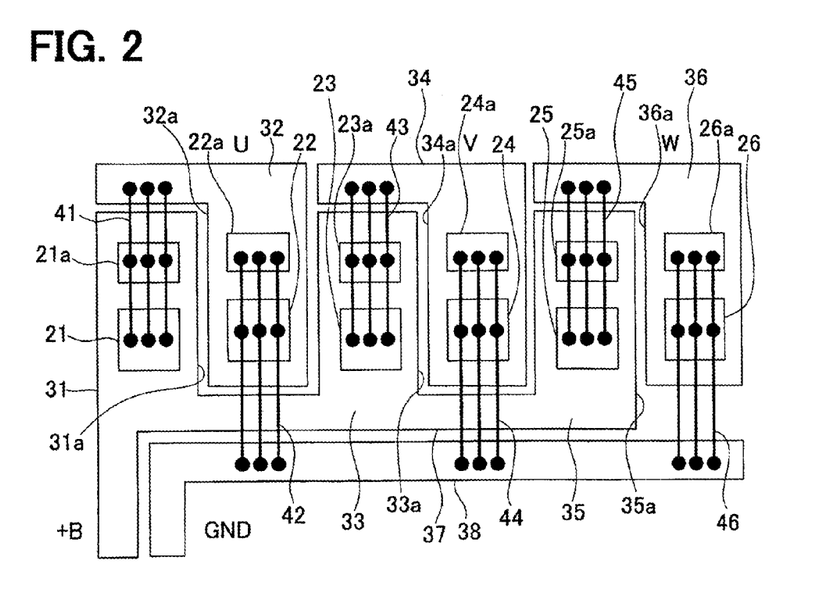
FIG. 2 is an explanatory view showing physical relationship of electric conductors shown in FIG. 1.

A method for manufacturing a power converting apparatus 10 according to a first embodiment of the present disclosure will be explained. FIG. 1 is a schematic perspective view showing a relevant portion of the power converting apparatus 10. FIG. 2 is an explanatory view showing physical relationship of electric conductors 31 to 36 shown in FIG. 1. In FIG. 1, a sealed body 12 (that is, a mold resin 12) and so on are omitted for the sake of simplicity of explanation.

The power converting apparatus 10 functions as an intelligent power module (IPM), wherein insulated gate bipolar transistors (IGBT), control circuits and so on are integrated into one module in order to increase its performance and function.

The power converting apparatus 10 shown in FIG. 1 has a power converting circuit, which converts voltage of direct current and outputs its converted voltage. The power converting circuit is composed of multiple pairs of a high-voltage side switching element and a low-voltage side switching element, wherein the high-voltage side and low-voltage side switching elements are connected in series while the respective pairs of the high-voltage side and the low-voltage side switching elements are arranged in parallel to one another.

More in detail, as shown in FIG. 2, a high-voltage side switching element 21 (a switching device 21) for a U-phase and a free wheeling diode 21a, which is connected to the switching device 21 in an inverse-parallel connection, are mounted to a high-voltage side electric conductor 31. A low-voltage side switching element 22 (a switching device 22) for the U-phase and a free wheeling diode 22a, which is connected to the switching device 22 in an inverse-parallel connection, are mounted to a low-voltage side electric conductor 32.

The electric conductors 31 and 32 are arranged in parallel to each other, so that a side end 31a of the electric conductor 31 and a side end 32a of the electric conductor 32 are opposing to each other in a horizontal direction of FIG. 2, to form an adjusted gap "dn" (as explained below) in order to reduce parasitic inductance. The electric conductors 31 and 32 are electrically connected to each other via wires 41, so that the switching devices 21 and 22 are electrically connected in series with each other.

In a similar manner, a high-voltage side switching element 23 (a switching device 23) for a V-phase and a free wheeling diode 23a, which is connected to the switching device 23 in an inverse-parallel connection, are mounted to a high-voltage side electric conductor 33. A low-voltage side switching element 24 (a switching device 24) for the V-phase and a free wheeling diode 24a, which is connected to the switching device 24 in an inverse-parallel connection, are mounted to a low-voltage side electric conductor 34.

The electric conductors 33 and 34 are arranged in parallel to each other, so that a side end 33a of the electric conductor 33 and a side end 34a of the electric conductor 34 are opposing to each other in the horizontal direction of FIG. 2, to form a predetermined gap (the adjusted gap) in order to reduce parasitic inductance. The electric conductors 33 and 34 are electrically connected to each other via wires 43, so that the switching devices 23 and 24 are electrically connected in series with each other.

In a similar manner, a high-voltage side switching element 25 (a switching device 25) for a W-phase and a free wheeling diode 25a, which is connected to the switching device 25 in an inverse-parallel connection, are mounted to a high-voltage side electric conductor 35. A low-voltage side switching element 26 (a switching device 26) for the W-phase and a free wheeling diode 26a, which is connected to the switching device 26 in an inverse-parallel connection, are mounted to a low-voltage side electric conductor 36.

The electric conductors 35 and 36 are arranged in parallel to each other, so that a side end 35a of the electric conductor 35 and a side end 36a of the electric conductor 36 are opposing to each other in the horizontal direction of FIG. 2, to form a predetermined gap (the adjusted gap) in order to reduce a parasitic inductance. The electric conductors 35 and 36 are electrically connected to each other via wires 45, so that the switching devices 25 and 26 are electrically connected in series with each other.

The high-voltage side electric conductors 31, 33 and 35 are directly connected to a power-supply wiring pattern 37. The low-voltage side electric conductor 32 is electrically connected to a ground wiring pattern 38 via wires 42 depending on an operation of the switching device 22 and/or the free wheeling diode 22a. The low-voltage side electric conductor 34 is electrically connected to the ground wiring pattern 38 via wires 44 depending on an operation of the switching device 24 and/or the free wheeling diode 24a. The low-voltage side electric conductor 36 is electrically connected to the ground wiring pattern 38 via wires 46 depending on an operation of the switching device 26 and/or the free wheeling diode 26a. The power-supply wiring pattern 37 and the ground wiring pattern 38 are arranged in parallel to each other via an adjusted gap "d2n", as explained below.

Figure 4A:
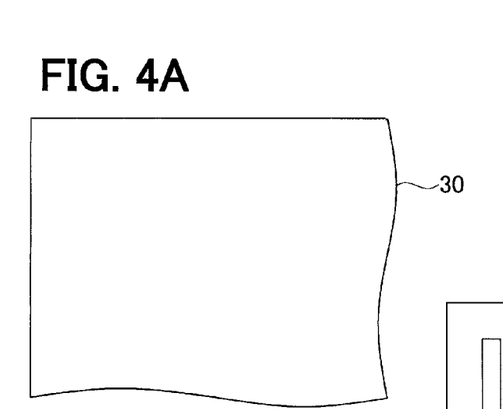
FIGS. 4A to 4E are explanatory views for explaining the manufacturing steps of FIG. 3.
Figure 4B:
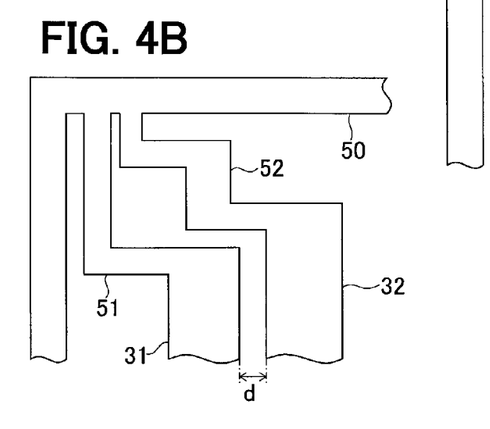
Figure 4C:
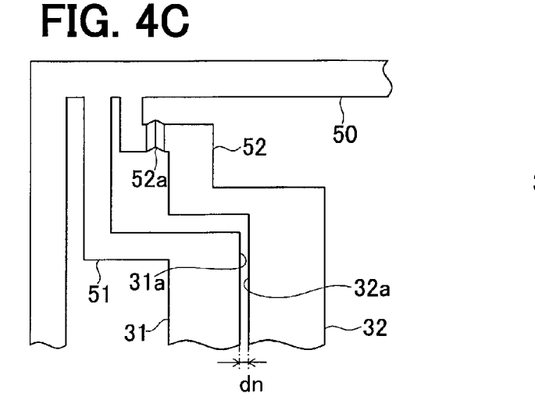
Figure 4D:
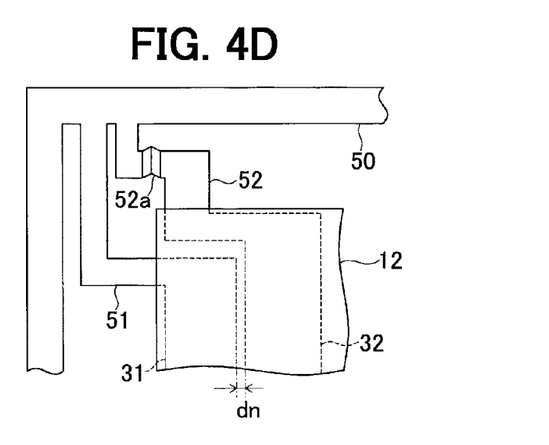
Figure 4E:
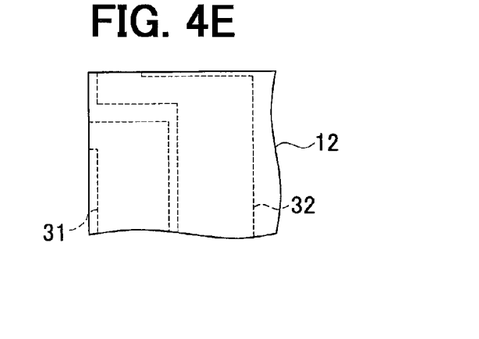

The switching devices 21 to 26 and the free wheeling diodes 21a to 26a, which are mounted to the corresponding electric conductors 31 to 36, are sealed by sealing material, such as, a molded resin 12 (as shown in FIGS. 4D and 4E). Each end portion of the low-voltage side electric conductors 32, 34 and 36 is exposed to an outside of a sealed body formed of the molded resin 12 (the sealing material), as a U-phase output terminal, a V-phase output terminal and a W-phase output terminal. Each one end of the power-supply wiring pattern 37 and the ground wiring pattern 38 is likewise exposed to the outside of the sealed body (12) as power-supply terminals.

Figure 3:
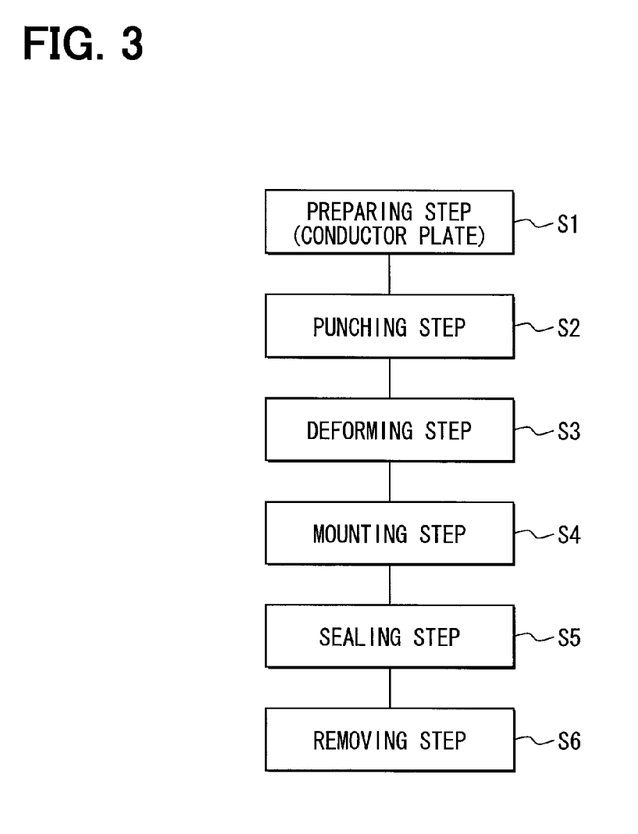
FIG. 3 is a process chart showing manufacturing steps for the power converting apparatus.
Figure 5A:
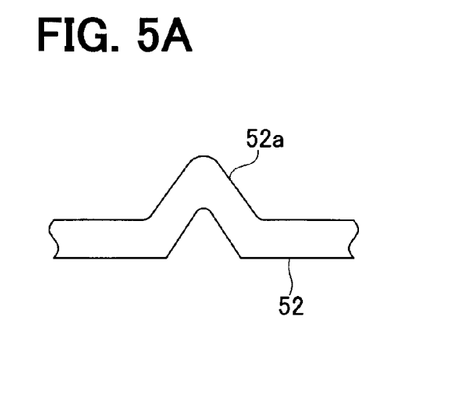
FIG. 5A is a schematically enlarged cross-sectional view showing a deformed condition of a connecting portion.
Figure 5B:
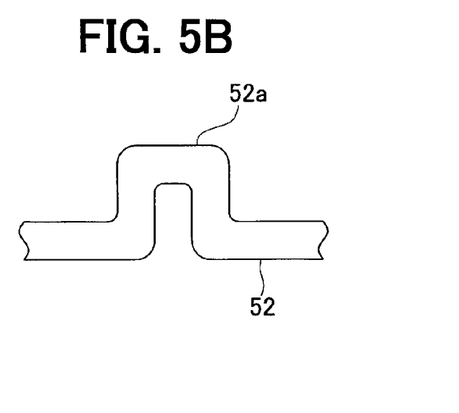
FIG. 5B is a schematically enlarged cross-sectional view showing another deformed condition of a connecting portion.

A method for manufacturing the power converting apparatus 10 will be explained with reference to FIGS. 3, 4A to 4E and 5A to 5B. FIG. 3 is a process chart showing manufacturing steps for the power converting apparatus. FIGS. 4A to 4E are explanatory views for explaining the manufacturing steps of FIG. 3. FIG. 5A is a schematically enlarged cross-sectional view showing a deformed condition of a connecting portion. FIG. 5B is a schematically enlarged cross-sectional view showing another deformed condition of a connecting portion. In FIGS. 4A to 4E, the switching devices 21 and 22 and the free wheeling diodes 21a and 22a and so on are omitted for the sake of simplicity.

In the present embodiment, each of respective gaps between the side ends 31a, 33a and 35a of the high-voltage side electric conductors 31, 33 and 35 and the side ends 32a, 34a and 36a of the low-voltage side electric conductors 32, 34 and 36 has a predetermined distance (which is referred to as a before-adjustment gap "d" or an initial gap "d") in each opposing direction, after a punching step. The initial gap (the before-adjustment gap) "d" is then made smaller than a plate thickness (for example, 500 μm) of the electric conductor by deformation of connecting portions, as explained below, in order to reduce the parasitic inductance.

Manufacturing steps for the power converting apparatus 10 will be further explained in detail, wherein a step for making the initial gap (the before-adjustment gap) "d" smaller corresponds to a characterizing feature of the present embodiment.

At first, at a first step S1 of FIG. 3 (a preparing step), one sheet of a conductive plate 30 is prepared as shown in FIG. 4A, from which the high-voltage side electric conductors 31, 33 and 35, the low-voltage side electric conductors 32, 34 and 36, the power-supply wiring pattern 37 and the ground wiring pattern 38 are formed. The conductive plate 30 is made of, for example, copper.

At a second step S2 of FIG. 3 (a punching step), a punching process is carried out for the conductive plate 30, so that each of the high-voltage side electric conductors 31, 33 and 35 and each of the low-voltage side electric conductors 32, 34 and 36 are arranged in parallel to one another and thereby the initial gaps (the before-adjustment gaps) "d" are respectively formed between the side ends 31a, 33a and 35a of the high-voltage side electric conductors 31, 33 and 35 and the side ends 32a, 34a and 36a of the low-voltage side electric conductors 32, 34 and 36. The respective electric conductors 31 to 36 are connected to one another via connecting portions.

More in detail, as shown in FIG. 4B, the conductive plate 30 is punched out so that each of the electric conductors 31 and 32 is respectively connected to a frame-shaped supporting portion 50 via a connecting portion 51 (connected to the electric conductor 31) and a connecting portion 52 (connected to the electric conductor 32). Although not shown in FIGS. 4A to 4E, the electric conductors 33 and 34 as well as the electric conductors 35 and 36 are connected to the supporting portion 50 via respective connecting portions in a similar manner to the electric conductors 31 and 32.

Then, at a third step S3 of FIG. 3 (a deforming step), the initial gap (the before-adjustment gap) "d" is made smaller by deforming a portion of the connecting portion. More in detail, as shown in FIG. 4C and FIG. 5A, an intermediate portion 52a of the connecting portion 52 is deformed in a deforming direction (which is a horizontal direction in FIG. 4C) by forming a V-letter-shaped bent portion, so as to move the electric conductor 32 toward the electric conductor 31 in an opposing direction of the electric conductors on the same plane to each other. As a result, the side end 32a of the electric conductor 32 is moved closer to the side end 31a of the electric conductor 31. Although not shown in FIG. 4C, each intermediate portion of the connecting portions for the electric conductors 34 and 36 is likewise deformed, so that the electric conductors 34 and 36 are moved closer to the corresponding electric conductors 33 and 35. Above deformed portions, such as the V-letter-shaped bent portion 52a, of the respective connecting portions 52 correspond to such portions, which are not sealed by the molded resin 12 (FIG. 4D).

When it is necessary to cool down the switching devices and corresponding free wheeling diodes, the electric conductors 31 to 36 (on which the switching devices and the free wheeling diodes are mounted) are arranged on the same plane, so that the electric conductors 31 to 36 can be brought into contact with one flat surface of a heat sink (not shown). It is, therefore, possible to connect the electric conductors 31 to 36 to the heat sink in a simpler manner.

As explained above, the initial gap (the before-adjustment gap) "d" between the respective electric conductors is made smaller than the thickness of the electric conductors. The adjusted gap "dn", which is smaller than the gap "d" shown in FIG. 4B, is shown in FIG. 4C.

A shape of the bent portion of the intermediate portion 52a, by which the before-adjustment gap "d" is made smaller, should not be limited to the V-letter shape as shown in FIG. 5A. The shape of the bent portion 52a may be modified to a U-letter shape, as shown in FIG. 5B.

At a fourth step S4 of FIG. 3 (a mounting step), the switching devices 21, 23 and 25 as well as the corresponding free wheeling diodes 21a, 23a and 25a are respectively mounted to the high-voltage side electric conductors 31, 33 and 35, while the switching devices 22, 24 and 26 as well as the corresponding free wheeling diodes 22a, 24a and 26a are respectively mounted to the low-voltage side electric conductors 32, 34 and 36, as shown in FIG. 2. Then, each of the switching devices 21 to 26 as well as each of the free wheeling diodes 21a to 26a is connected to the corresponding electric conductors 31 to 36 by use of the wires 41 to 46 by a wire-bonding process.

At a subsequent step S5 of FIG. 3 (a sealing step), the respective switching devices 21 to 26, center portions of the respective electric conductors 31 to 36 and so on are sealed by the sealing material (the molded resin 12), as shown in FIG. 4D.

At a step S6 of FIG. 3 (a removing step), the connecting portions 51 and 52 as well as other connecting portions (not shown) connected to the supporting portion 50 are cut away, so that connection between the electric conductors via the connecting portions is released, as shown in FIG. 4E. As a result, the power converting circuit is completed.

As explained above, according to the method of the present embodiment for manufacturing the power converting apparatus 10, the conductive plate 30 is prepared at the step S1 (the preparing step), from which high-voltage side electric conductors 31, 33 and 35 as well as the low-voltage side electric conductors 32, 34 and 36 are formed. The conductive plate 30 is punched out at the step S2 (the punching step) to form the electric conductors 31 to 36, in such a way that the electric conductors 31, 33 and 35 and the electric conductors 32, 34 and 36 alternately arranged in parallel to one another, to thereby form the initial gaps "d" (the before-adjustment gaps "d") between the respective side ends 31a, 33a and 35a of the electric conductors 31, 33 and 35 and the respective side ends 32a, 34a and 36a of the electric conductors 32, 34 and 36. At the same time, the conductive plate 30 is punched out so that each of the electric conductors 31 to 36 are connected to one another via the respective connecting portions 51 and 52.

Then, at the step S3 (the deforming step), the intermediate portions 52a of the respective connecting portions 52 for the low-voltage side electric conductors 32, 34 and 36 are deformed so as to change the initial gaps "d" (the before-adjustment gaps "d") to the smaller value. At the step S4 (the mounting step), the switching devices 21, 23 and 25 are respectively mounted to the high-voltage side electric conductors 31, 33 and 35, while the switching devices 22, 24 and 26 are respectively mounted to the low-voltage side electric conductors 32, 34 and 36. At the step S5 (the sealing step), the switching devices 21 to 26 as well as the center portions of the electric conductors 31 to 36 are sealed by the sealing material (the molded resin 12). And at the step S6 (the removing step), the connecting portions 51 and 52 (including the supporting portion 50) are cut away so that the connections among the electric conductors 31 to 36 via the connecting portions are released, to thereby form the power converting circuit.

As above, after the high-voltage side electric conductors 31, 33 and 35 and the low-voltage side electric conductors 32, 34 and 36, which are arranged in parallel to one another across the initial gaps (the before-adjustment gaps) "d", are formed from one sheet of the conductive plate 30 through the punching step (S2), the initial gaps (the before-adjustment gaps) "d" can be made smaller by deforming the portion of the respective connecting portions 51 and 52, via which the electric conductors 31 to 36 are connected to one another.

Therefore, the value of the respective initial gap "d" between the respective high-voltage side electric conductor 31, 33 and 35 and the respective low-voltage side electric conductor 32, 34 and 36 can be made smaller without being influenced by criteria of stable machining at the punching step for the conductive plate 30.

Since the initial gap "d" can be made smaller than the thickness of the respective electric conductors 31 to 36 by deforming the portion (52a) of the connecting portion 51 and/or 52 at the deforming step (S3), it is possible to easily manufacture the electric conductors 31 to 36, which are arranged in parallel to one another via the respective adjusted gaps "dn" smaller than the initial gaps (the before-adjustment gaps) "d" and smaller than the thickness of the electric conductors.

In addition, at the deforming step (S3), the portion (52a) of the connecting portion 51 and/or 52, which corresponds to such a portion that is not sealed by the sealing material (the molded resin 12) at the sealing step (S5), is deformed so as to make the initial gap "d" smaller (to the adjusted gap "dn"). Therefore, even when the resin material is injected into a molding die at the sealing step (S5), such injection pressure is not directly applied to the deformed portion 52a of the connecting portion. As a result, it is possible to avoid such a situation that the adjusted gap "dn" is varied by possible influence of the injection pressure. In other words, a possible decrease of processing accuracy for the adjusted gap "dn", which may take place in the sealing step, can be avoided.

Figure 6:
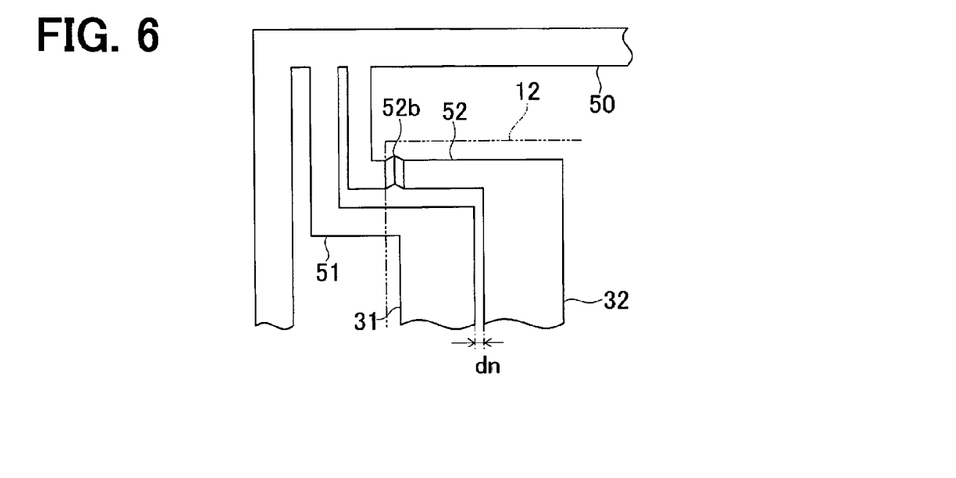
FIG. 6 is a schematic explanatory view showing a portion of a step for manufacturing the power converting apparatus according to a first modification of the first embodiment.
Figure 7A:
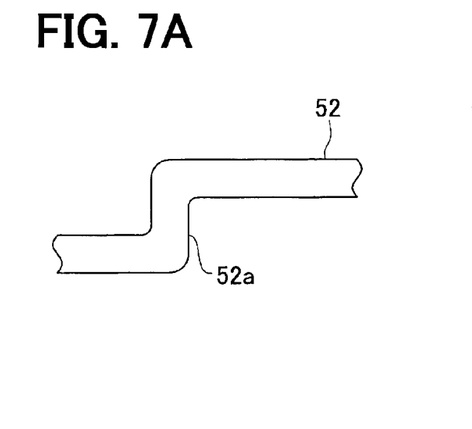
FIGS. 7A and 7B are schematic explanatory views showing a portion of a step for manufacturing the power converting apparatus according to a second modification of the first embodiment.
Figure 7B:
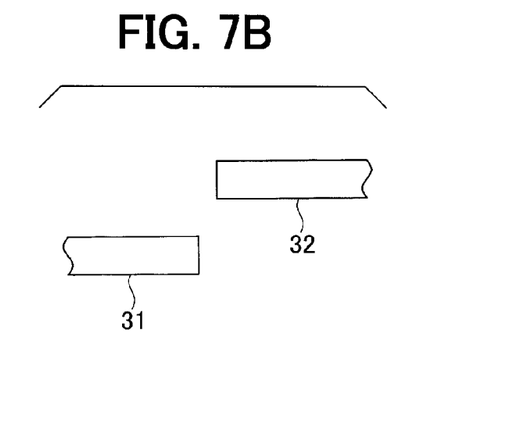

FIG. 6 is a schematic explanatory view showing a portion of a step for manufacturing the power converting apparatus according to a first modification of the first embodiment. FIGS. 7A and 7B are schematic explanatory views showing a portion of a step for manufacturing the power converting apparatus according to a second modification of the first embodiment.

As shown in FIG. 6, a deformed portion 52b is provided at such a portion of the connecting portion 52, which is sealed by the sealing material (the molded resin 12), so that the initial gap (the before-adjustment gap) "d" is changed to the smaller adjusted gap "dn".

In the above first embodiment, the intermediate portion 52a of the connecting portion 52 is deformed so that the low-voltage side electric conductor 32 is moved on the same plane (the same level) to the high-voltage side electric conductor 31 in the direction closer to the high-voltage side electric conductor 31, to thereby change the initial gap "d" to the smaller adjusted gap "dn". However, the portion of the connecting portion 52 may be deformed in such a way that the low-voltage side electric conductor is displaced with respect to the high-voltage side electric conductor in a thickness direction of the electric conductors, in order to make the initial gap "d" smaller.

For example, the intermediate portion 52a of the connecting portion 52 is deformed (bent) in an L-letter shape, as shown in FIG. 7A, so that the low-voltage side electric conductor 32 is moved not only in the thickness direction of the electric conductor 32 (in an upward direction of FIG. 7B) but also in the direction toward the high-voltage side electric conductor 31. In other words, the low-voltage side electric conductor 32 is displaced at a different level from that of the high-voltage side electric conductor 31. As a result, the initial gap between them in the horizontal direction is made smaller. The connecting portions of the other two low-voltage side electric conductors 34 and 36 are deformed in the same manner to the intermediate portion 52a, so that the respective gaps in the horizontal direction between the high-voltage side electric conductors 33 and 35 and the low-voltage side electric conductors 34 and 36 are made smaller. According to the above structure, even when the low-voltage side electric conductors 32, 34 and 36 are moved in a direction perpendicular to the thickness direction with respect to the high-voltage side electric conductors 31, 33 and 35, the low-voltage side electric conductors 32, 34 and 36 are not brought into contact with the high-voltage side electric conductors 31, 33 and 35. Therefore, even when the gap in the horizontal direction between them is made smaller, it is possible to avoid such a situation of bad electrical contact.

(Second Embodiment)

Figure 8:
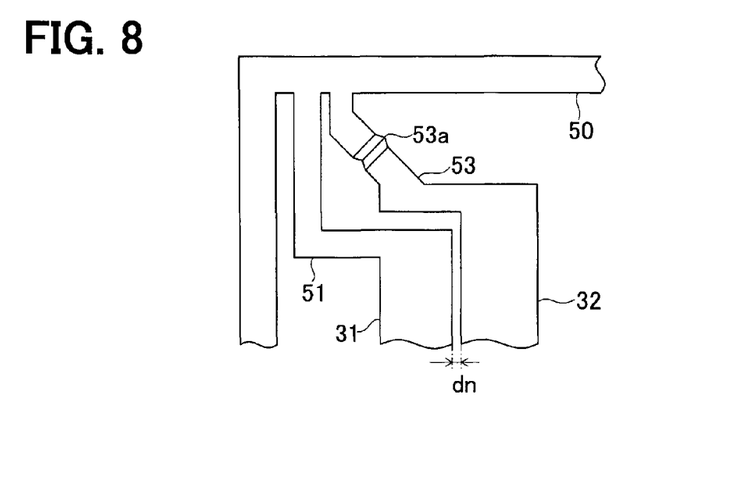
FIG. 8 is a schematic explanatory view showing a portion of a step for manufacturing the power converting apparatus according to a second embodiment of the present disclosure.

A method for manufacturing the electronic apparatus according to a second embodiment of the present disclosure will be explained with reference to FIG. 8. FIG. 8 is a schematic explanatory view showing a portion of a step for manufacturing the power converting apparatus according to the second embodiment.

The manufacturing method for the power converting apparatus 10 of the second embodiment differs from that of the first embodiment in that a direction of deforming the connecting portion of the second embodiment is different from that of the first embodiment.

A characterizing step of the second embodiment will be explained with reference to FIG. 8, wherein the electric conductors 31 and 32 are shown as examples.

As shown in FIG. 8, the low-voltage side electric conductor 32 is connected to the supporting portion 50 via a connecting portion 53, which extends in a direction inclined by an angle of 45 degrees with respect to the horizontal direction of FIG. 8 (that is, an opposing direction of the electric conductors 31 and 32). And an intermediate portion 53a of the connecting portion 53 is deformed (bent) in such an inclined direction (a deforming direction). In other words, the deformed portion 53a is formed in a V-letter shape in a cross-sectional plane, which is in line with the extending direction of the connecting portion 53, namely which is inclined by 45 degrees with respect to the opposing direction of the electric conductors 31 and 32.

When the intermediate portion 53a is deformed as above (in the deforming direction), the initial gap (the before-adjustment gap) "d" between the electric conductors 31 and 32 is reduced to the smaller adjusted gap "dn". Since an amount of the movement of the electric conductor 32 (of the low-voltage side) in the horizontal direction toward the electric conductor 31 (of the high-voltage side) is smaller than that of the electric conductor 32 in the deforming direction, fine adjustment becomes easier for reducing the initial gap "d" to the adjusted gap "dn" in the horizontal direction. It is, therefore, possible to accurately form the adjusted gap "dn".

In the above embodiment, the deforming direction for the intermediate portion 53a is almost 45 degrees. However, the deforming direction should not be limited to the angle of 45 degrees, but may be set at any amount between 0 and 90 degrees with respect to the horizontal direction.

The above structure is likewise applied to the other electric conductors 33 and 34 as well as 35 and 36. For example, although not shown in the drawings, one of the connecting portions for the electric conductors 33 and 34 is inclined with respect to the horizontal direction (that is, the opposing direction of the electric conductors 33 and 34), and an intermediate portion of such inclined connecting portion is deformed in the deforming direction, which is inclined by an angle smaller than 90 degrees with respect to the horizontal direction, so that the initial gap "d" is reduced to the smaller adjusted gap "dn".

The manufacturing method for the power converting apparatus 10 of the above second embodiment may be also modified in such a way similar to those of the first embodiment. In other words, modifications of FIG. 6 and/or FIGS. 7A and 7B may be applied to the second embodiment.

Figure 9A:
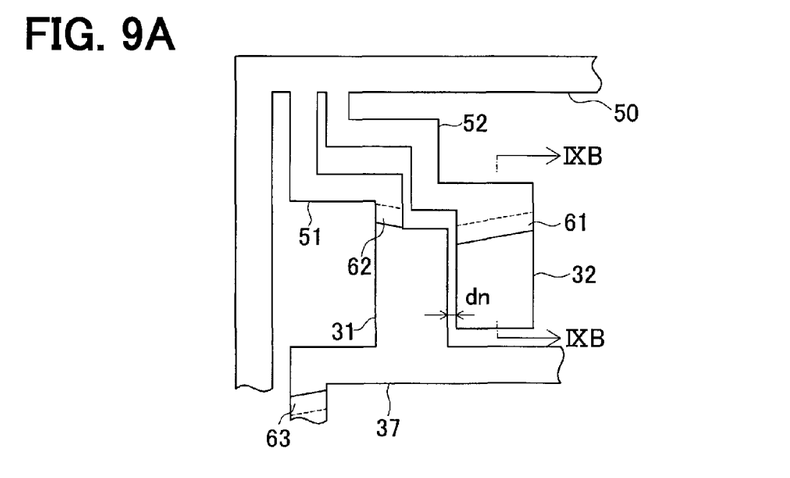
FIG. 9A is a schematic explanatory view showing a portion of a step for manufacturing the power converting apparatus according to a modification of the second embodiment.
Figure 9B:
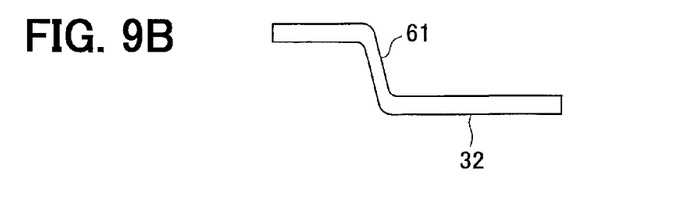
FIG. 9B is a cross sectional view taken along a line IXB-IXB in FIG. 9A.

FIG. 9A is a schematic explanatory view showing a portion of a step for manufacturing the power converting apparatus according to a modification of the second embodiment. FIG. 9B is a cross sectional view taken along a line IXB-IXB in FIG. 9A.

As shown in FIGS. 9A and 9B, multiple portions 61, 62 and 63 of the electric conductors 31 and 32 (including the power-supply wiring portion 37) and/or its connecting portions 51 or 52 are deformed in respective deforming directions, each of which is inclined by respective angles with respect to the horizontal direction (that is, the opposing direction of the electric conductors 31 and 32), in order to reduce the initial gap "d" to the smaller adjusted gap "dn". As shown in FIG. 9B, the deformed portion 61 is formed in the L-letter shape in a cross sectional plane, which is perpendicular to the horizontal direction, so that a main part of the electric conductor 32 is displaced in the thickness direction from the other part of the electric conductor 32, for example, displaced in the thickness direction from the connecting portion 52. The deformed portions 62 and 63 have a similar structure to that of the deformed portion 61.

(Third Embodiment)

Figure 10A:
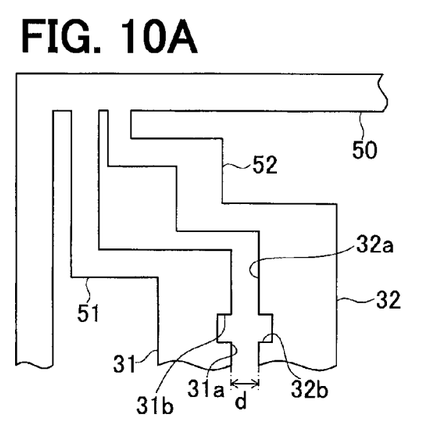
FIG. 10A shows a punching step and FIG. 10B shows a deforming step.
Figure 10B:
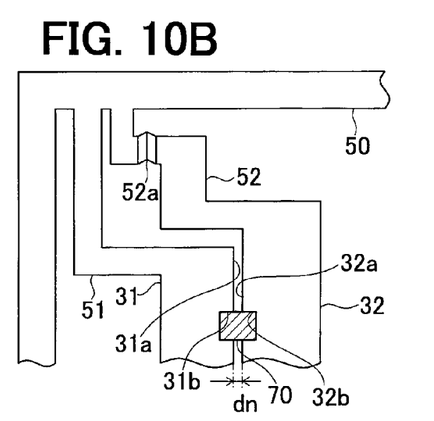

A method for manufacturing the electronic apparatus according to a third embodiment of the present disclosure will be explained with reference to FIGS. 10A and 10B. FIGS. 10A and 10B are schematic explanatory views respectively showing a portion of a step for manufacturing the power converting apparatus according to the third embodiment, wherein FIG. 10A shows a punching step and FIG. 10B shows a deforming step.

The manufacturing step of the third embodiment differs from that of the first embodiment in that a jig 70 is used for the manufacturing step of the third embodiment.

Characterizing steps of the third embodiment will be explained with reference to FIGS. 10A and 10B, wherein the electric conductors 31 and 32 are shown as examples.

As shown in FIG. 10A, in the punching step (S2 of FIG. 3), a pair of cut-out portions 31b and 32b are formed at the respective side ends 31a and 32a of the electric conductors 31 and 32.

Then, as shown in FIG. 10B, in the deforming step (S3 of FIG. 3), the jig 70 is inserted into a space formed between the cut-out portions 31b and 32b and the intermediate portion 52a of the connecting portion 52 is deformed, for example, bent in the V-letter shape. The electric conductor 32 is moved toward the electric conductor 31 until each bottom end of the cut-out portions 31b and 32b is brought into contact with each side end of the jig 70. A further movement of the electric conductor 32 toward the electric conductor 31 is restricted by the jig 70.

Accordingly, it is possible to easily control the adjusted gap "dn" by a length of the jig 70 in the horizontal direction (that is, the opposing direction of the electric conductors 31 and 32).

It is not always necessary to form the cut-out portions 31b and 32b in each of the electric conductors 31 and 32. In other words, the cut-out portion may be formed in either one of the electric conductors 31 and 32.

The above structure as well as the manufacturing step is likewise applied to the electric conductors 33 and 34. For example, although not shown in the drawings, a cut-out portion is formed in either one of the electric conductors 33 and 34 in the punching step (S2 of FIG. 3). A jig is inserted into a space formed by the cut-out portion and then an intermediate portion of the connecting portion for the electric conductor 34 is deformed. In the same manner, the above structure and the manufacturing step are applied to the electric conductors 35 and 36.

The above structure and the manufacturing step of the third embodiment for reducing the initial gap "d" to the smaller adjusted gap "dn" may be applied to the above first and/or second embodiments (including their modifications).
(Fourth Embodiment)

Figure 11A:
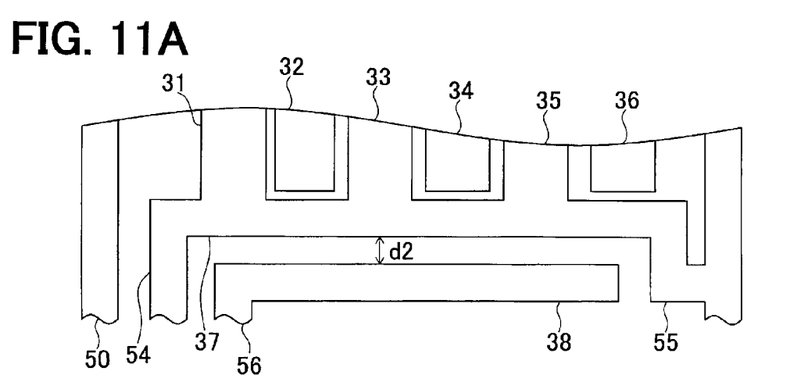
FIG. 11A shows a punching step and FIG. 11B shows a deforming step.
Figure 11B:
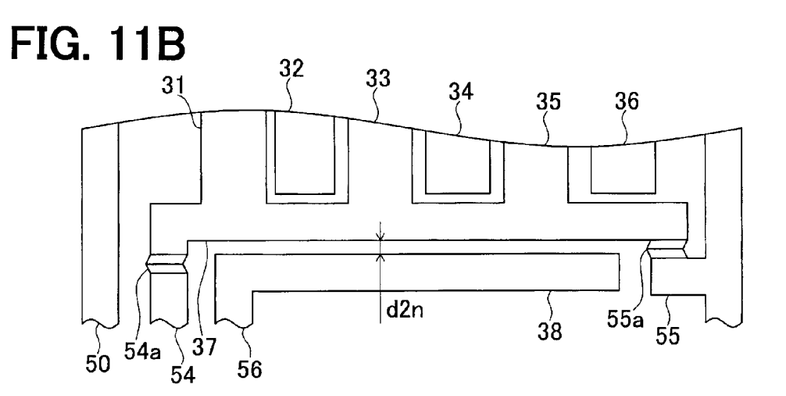

A method for manufacturing the electronic apparatus according to a fourth embodiment of the present disclosure will be explained with reference to FIGS. 11A and 11B. FIGS. 11A and 11B are schematic explanatory views respectively showing a portion of a step for manufacturing the power converting apparatus according to the fourth embodiment, wherein FIG. 11A shows a punching step and FIG. 11B shows a deforming step.

The manufacturing method of the fourth embodiment differs from that of the first embodiment in that a distance (a gap) between the power-supply wiring pattern 37 and the ground wiring pattern 38 is likewise reduced by deforming a portion of a connecting portion.

A characterizing step of the fourth embodiment will be explained with reference to FIGS. 11A and 11B.

As shown in FIG. 11A, in the punching step (S2 of FIG. 3), the power-supply wiring pattern 37 and the ground wiring pattern 38 are formed so that they are arranged in parallel to each other across an initial gap "d2" in an opposing direction of the wiring patterns 37 and 38 (that is, an up-down direction in the drawing). The power-supply wiring pattern 37 is connected to the supporting portion 50 (made from the conductive plate 30) via connecting portions 54 and 55, while the ground wiring pattern 38 is connected to the supporting portion 50 via a connecting portion 56.

Then, as shown in FIG. 11B, in the deforming step (S3 of FIG. 3), an intermediate portion 54a of the connecting portion 54 as well as an intermediate portion 55a of the connecting portion 55 is deformed (for example, bent in the V-letter shape), so that the initial gap "d2" is decreased to a smaller adjusted gap "d2n" in the opposing direction of the wiring patterns 37 and 38. As above, it is also possible to easily make smaller the gap between the power-supply wiring pattern 37, to which the high-voltage side electric conductors 31, 33 and 35 are connected, and the ground wiring pattern 38, to which the low-voltage side electric conductors 32, 34 and 36 are connected.

The characterizing step of the modifications of the first embodiment as well as the characterizing steps of the other embodiments may be also applied to the fourth embodiment so as to reduce the initial gap "d2" to the smaller adjusted gap "d2n".

Alternatively, it is further possible to reduce only the initial gap "d2" to the smaller adjusted gap "d2n" in the up-down direction of the drawing, while the initial gaps "d" in the horizontal direction between the high-voltage side electric conductors 31, 33 and 35 and the low-voltage side electric conductors 32, 34 and 36 are maintained (not reduced) as they are.
(Fifth Embodiment)

A method for manufacturing the electronic apparatus according to a fifth embodiment of the present disclosure will be explained with reference to FIGS. 12A to 12E. FIGS. 12A to 12E are explanatory views for explaining manufacturing steps for an electronic apparatus 10a.

In the above first embodiment, for example, the electronic apparatus 10 has the power converting circuit, which is composed of multiple pairs of switching devices 21 and 22, 23 and 24, and 25 and 26. And as shown in FIG. 2, the switching devices forming the respective pairs are connected in series, while the respective pairs are arranged in parallel to one another.

The electronic apparatus 10a of the fifth embodiment is different from that of the first embodiment in the following points.

Figure 12A:
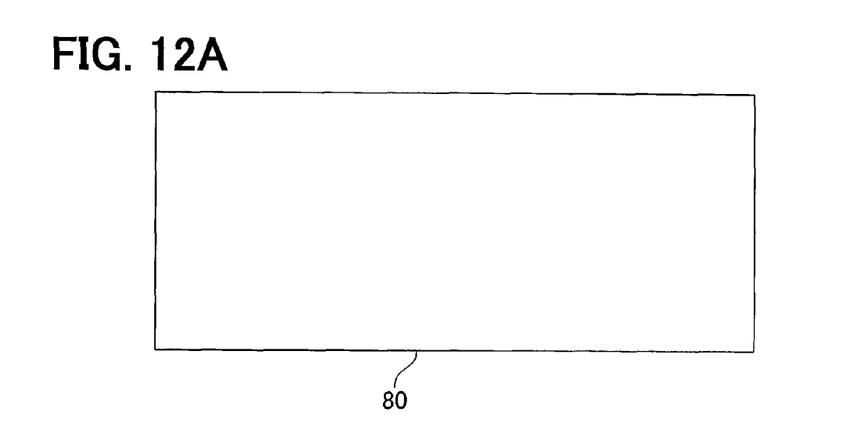
FIGS. 12A to 12E are explanatory views for explaining manufacturing steps for an electronic apparatus according to a fifth embodiment of the present disclosure.
Figure 12B:
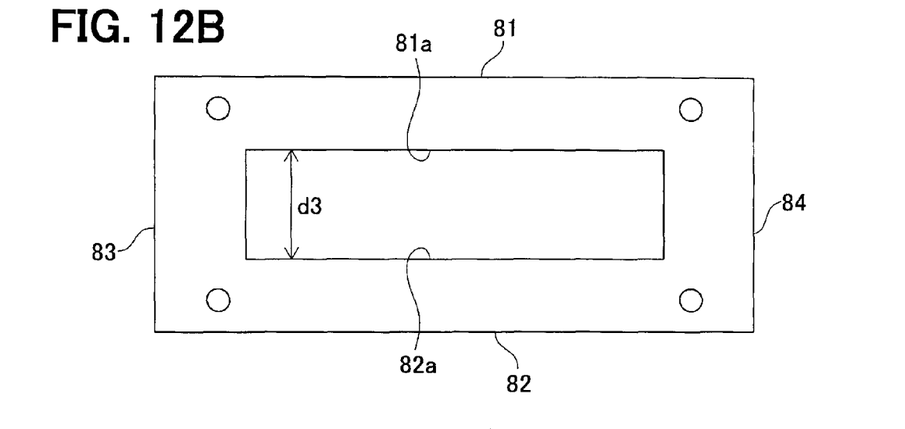
Figure 12C:
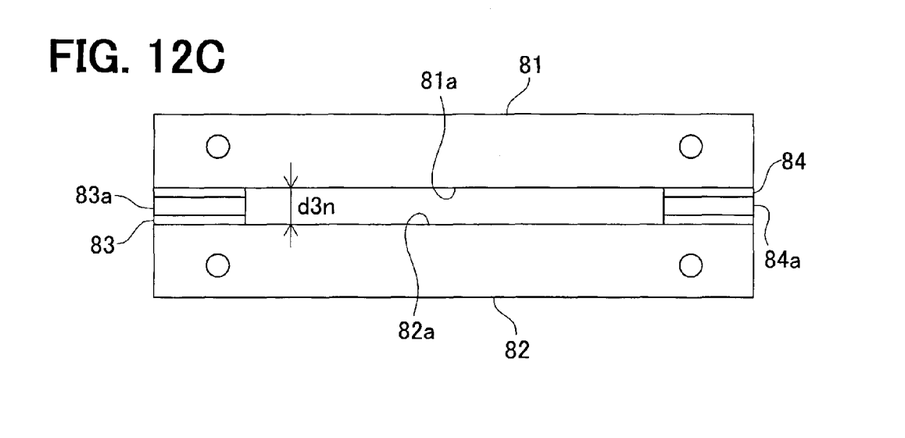
Figure 12D:
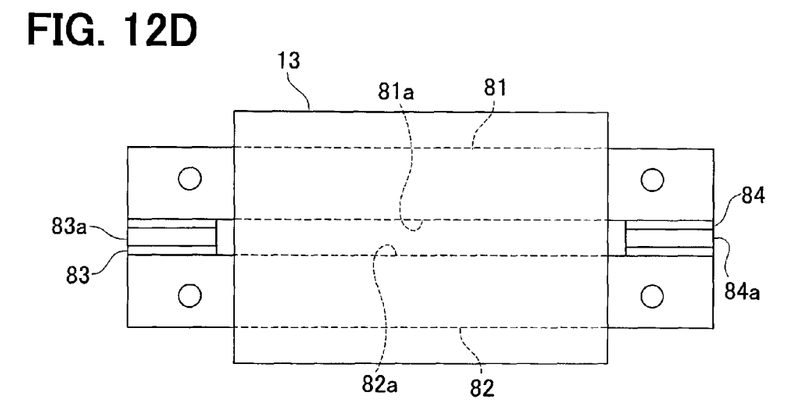
Figure 12E:
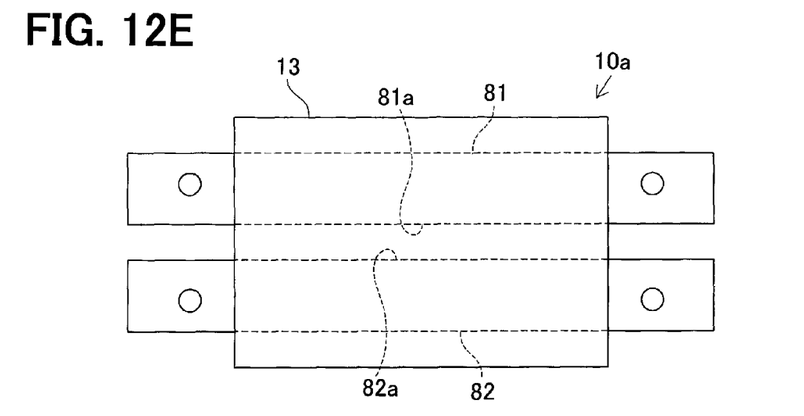

In the electronic apparatus 10a, as shown in FIG. 12E, a high-voltage side bus bar 81 and a low-voltage side bus bar 82 are arranged in parallel to each other. At least a portion of each bus bar 81 and 82 is sealed by sealing material (a molded resin 13).

The method for manufacturing the electronic apparatus 10a will be explained with reference to FIGS. 12A to 12E.

As shown in FIG. 12A, one sheet of a conductive plate 80 is prepared for forming the bus bar 81 and the bus bar 82.

As shown in FIG. 12B, the bus bars 81 and 82 are formed by a punching step from the conductive plate 80, so that the bus bars 81 and 82 are arranged in parallel to each other across an initial gap "d3" (a before-adjustment gap "d3") in an opposing direction of the bus bars, that is, in an up-down direction of the drawing (FIG. 12B) in which a side end 81a of the bus bar 81 and a side end 82a of the bus bar 82 are opposing to each other. A pair of connecting portions 83 and 84 is formed by the punching step, so that the bus bars 81 and 82 are connected to each other via the connecting portions 83 and 84.

Then, as shown in FIG. 12C, an intermediate portion 83a of the connecting portion 83 as well as an intermediate portion 84a of the connecting portion 84 is deformed, for example, bent in a V-letter shape (like the shape shown in FIG. 5A) on a cross sectional plane extending in a deforming direction (that is, the up-down direction of the drawing). The side end 81a of the bus bar 81 and the side end 82a of the bus bar 82 are relatively moved closer to each other on the same plane in the opposing direction (that is, the deforming direction), so that the initial gap "d3" is made smaller to an adjusted gap "d3n", which is smaller than a thickness of the conductive plate 80.

The deformed shape of the intermediate portion 83a or 84a should not be limited to the V-letter shape. The intermediate portions 83a and 84a may be formed in a U-letter shape (like the shape shown in FIG. 5B) so as to reduce the initial gap "d3".

Then, as shown in FIG. 12D, after the electronic parts (not shown) are mounted to the bus bars 81 and 82, center portions of the bus bars 81 and 82 are sealed by the molded resin 13 (the processes respectively correspond to the mounting step S4 and the sealing step S5 of FIG. 3). And, as shown in FIG. 12E, the connecting portions 83 and 84 are cut away, so that the bus bars 81 and 82 are separated from each other. This process corresponds to the removing step S6 of FIG. 3.

As explained above, according to the manufacturing method for the electronic apparatus 10a of the present embodiment, one sheet of the conductive plate 80 is prepared for forming by the punching step the bus bars 81 and 82, which are arranged in parallel to each other to form the initial gap "d3" (the before-adjustment gap "d3") between the side end 81a of the bus bar 81 and the side end 82a of the bus bar 82. The connecting portions 83 and 84 are also formed from the conductive plate 80 by the punching step, so that the bus bars 81 and 82 are connected to each other via the connecting portions 83 and 84. The intermediate portions 83a and 84a of the respective connecting portions 83 and 84 are deformed (bent) so as to reduce the initial gap "d3" (the before-adjustment gap "d3") to the smaller adjusted gap "d3n". After the center portions of the bus bars 81 and 82 are sealed with the molded resin 13, the connecting portions 83 and 84 are cut away so that the bus bars 81 and 82 are separated from each other.

As above, after the bus bars 81 and 82, which are arranged in parallel to each other across the initial gap "d3", are formed from one sheet of the conductive plate 80 through the punching step, the initial gap "d3" can be made smaller by deforming the portion of the respective connecting portions 83 and 84, via which the bus bars 81 and 82 are connected to each other. Accordingly, the smaller adjusted gap "d3n" can be achieved.

Therefore, it is possible to make smaller the gap between the bus bars 81 and 82, which are formed from one sheet of the conductive plate 80 and which are arranged in parallel to each other, without being influenced by criteria of stable machining at the punching step for the conductive plate 80.

The characterizing step of the modifications of the first embodiment as well as the characterizing steps of the other embodiments may be also applied to the fifth embodiment so as to reduce the initial gap "d3" between the bus bars 81 and 82 to the smaller adjusted gap "d3n".

(Sixth Embodiment)

Figure 13:
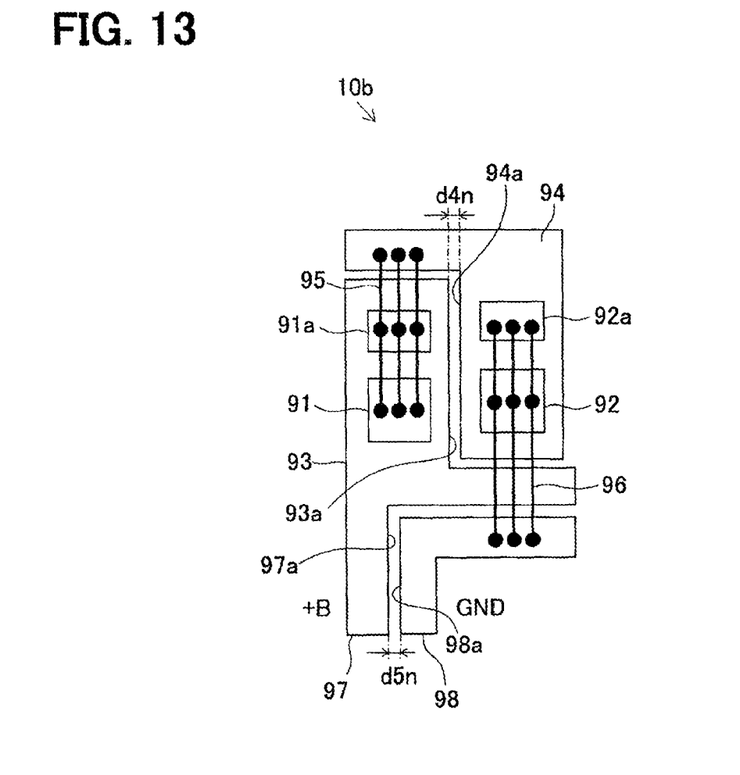
FIG. 13 is an explanatory view showing a relevant portion of a power converting apparatus according to a sixth embodiment of the present disclosure.

A method for manufacturing the electronic apparatus according to a sixth embodiment of the present disclosure will be explained with reference to FIG. 13. FIG. 13 is an explanatory view showing a relevant portion of a power converting apparatus 10b of the sixth embodiment.

As shown in FIG. 13, the power converting apparatus 10b has a half-bridge circuit, which is composed of a high-voltage side switching element 91 (a switching device 91) and a low-voltage side switching element 92 (a switching device 92) connected in series with each other. In the power converting apparatus 10b, the switching device 91 and a free wheeling diode 91a, which is connected to the switching device 91 in an inverse-parallel connection, are mounted to a high-voltage side electric conductor 93, while the switching device 92 and a free wheeling diode 92a, which is connected to the switching device 92 in an inverse-parallel connection, are mounted to a low-voltage side electric conductor 94. The high-voltage side and the low-voltage side electric conductors 93 and 94 are arranged in parallel to each other.

The high-voltage side and the low-voltage side electric conductors 93 and 94 are electrically connected to each other via wires 95 depending on an operation of the switching device 91 or the free wheeling diode 91a, so that the high-voltage side and the low-voltage side switching devices 91 and 92 are electrically connected in series.

The high-voltage side electric conductor 93 is directly connected to a power-supply wiring pattern 97. The low-voltage side electric conductor 92 is electrically connected to a ground wiring pattern 98 via wires 96 depending on an operation of the switching device 92 or the free wheeling diode 92a.

The electric conductors 93 and 94 are arranged in parallel to each other, so that a side end 93a of the electric conductor 93 and a side end 94a of the electric conductor 94 are opposing to each other in an opposing direction (in a horizontal direction of FIG. 13), to form a predetermined gap (an adjusted gap "d4n") in order to reduce parasitic inductance. In a similar manner, the power-supply wiring pattern 97 and the ground wiring pattern 98 are arranged in parallel to each other, so that a side end 97a and a side end 98a are opposing to each other in an opposing direction (in the horizontal direction of FIG. 13), to form a predetermined gap (an adjusted gap "d5n").

A method for manufacturing the power converting apparatus 10b of the present embodiment will be explained.

In a deforming step (corresponding to the step S3 of FIG. 3), a portion of a connecting portion, which connects the low-voltage side electric conductor 94 to a supporting portion (not shown but corresponding to the supporting portion 50 shown in FIG. 4C), is deformed so that an initial gap "d4" (not shown) between the electric conductors 93 and 94 is reduced to the smaller adjusted gap "d4n". In a similar manner, a portion of a conductor portion, which connects the ground wiring pattern 98 to the supporting portion, is deformed (not shown in FIG. 13) so that an initial gap "d5" (not shown) between the power-supply wiring pattern 97 and the ground wiring pattern 98 is reduced to the smaller adjusted gap "d5n". The deforming step of the above-explained embodiments can be also applied to the deforming step of the present embodiment.

In a mounting step (corresponding to the mounting step S4 of FIG. 3), the high-voltage side switching device 91, the diodes 91a and so on are mounted to the high-voltage side electric conductor 93, while the low-voltage side switching device 92, the diodes 92a and so on are mounted to the low-voltage side electric conductor 94. In a sealing step and a removing step (respectively corresponding to the sealing step S5 and the removing step S6 of FIG. 3), the switching devices 91 and 92, the diodes 91a and 92a as well as center portions of the electric conductors 93 and 94 are sealed by the sealing material (the molded resin: not shown). Then, the connecting portions are cut away, so that the electric conductors 93 and 94 and the power-supply wiring pattern 97 and the ground wiring pattern 98 are separated from each other, to thereby form the half-bridge circuit.

According to the power converting apparatus 10b of the present embodiment, the high-voltage side and the low-voltage side switching devices 91 and 92 are respectively mounted to the high-voltage side and the low-voltage side electric conductors 93 and 94, which are made from one sheet of the conductive plate. The high-voltage side and the low-voltage side electric conductors 93 and 94 as well as the power-supply wiring pattern 97 and the ground wiring pattern 98 are respectively arranged in parallel to each other, however the respective gaps between them can be made smaller ("d4n" and "d5n").

The present disclosure should not be limited to the above embodiments, but may be modified in various manners, for example, as below:

(1) The manufacturing method of the present disclosure should not be limited to the manufacturing method for the power converting apparatus 10 or the electronic apparatus 10a. The present disclosure can be applied to a manufacturing method for other electronic apparatuses, wherein a high-voltage side and a low-voltage side electric conductor are arranged in parallel to each other, and at least some portions of the electric conductors are sealed by the sealing material, such as the molded resin.

(2) In the above embodiments, each of the initial gaps (the before-adjustment gaps) "d", "d2" and "d3" is made smaller by the respective deforming steps to the adjusted gap "dn", "d2n" and "d3n", which is smaller than the thickness of the electric conductors. However, the adjusted gap should not be limited to such a value smaller than the thickness of the electric conductor.

(3) In the above embodiments, for example, as shown in FIG. 4B, the electric conductors 31 and 32 are connected to each other via the connecting portions 51 and 52 and via the supporting portion 50. However, the electric conductors may be connected to each other via the connecting portion (s) without the supporting portion 50.

(4) The conductive plates 30 and 80 are made of copper in the above embodiments. However, the conductive plates may be made of other metal material.

What is claimed is:

1. A method for manufacturing an electronic apparatus, which has a high-voltage side electric conductor and a low-voltage side electric conductor, wherein the high-voltage side and the low-voltage side electric conductors are arranged in parallel to each other and at least portions of the high-voltage side and the low-voltage side electric conductors are sealed by sealing material, comprising:
- a first step for preparing a sheet of a conductive plate for forming the high-voltage side and the low-voltage side electric conductors;
- a second step for punching out the conductive plate, to thereby form the high-voltage side and the low-voltage side electric conductors as well as connecting portions, in such a manner that a side end of the high-voltage side electric conductor and a side end of the low-voltage side electric conductor are opposing to each other in an opposing direction so as to form a predetermined initial gap between the respective side ends of the high-voltage side and the low-voltage side electric conductors, and that the high-voltage side and the low-voltage side electric conductors are connected to each other via the connecting portions;
- a third step for deforming a portion of the connecting portion and/or deforming a portion of the high-voltage side or the low-voltage side electric conductor, so as to reduce the initial gap to a smaller gap;
- a fourth step for sealing the portions of the high-voltage side and the low-voltage side electric conductors by the sealing material; and
- a fifth step for cutting away the connecting portions after the fourth step, so that the high-voltage side and the low-voltage side electric conductors are separated from each other.

2. The method for manufacturing the electronic apparatus according to claim 1,
- wherein the electronic apparatus is composed of a power converting circuit having a high-voltage side switching device and a low-voltage side switching device, wherein the high-voltage side and the low-voltage side switching devices are connected in series, wherein the high-voltage side switching device is mounted to the high-voltage side electric conductor while the low-voltage side switching device is mounted to the low-voltage side electric conductor, and wherein the high-voltage side and the low-voltage side electric conductors are arranged in parallel to each other,
- wherein the method for manufacturing the electronic apparatus further comprises;
- a mounting step, after the third step, for mounting the high-voltage side switching device to the high-voltage side electric conductor and mounting the low-voltage side switching device to the low-voltage side electric conductor, and
- wherein the connecting portions are cut away in the fifth step after the portions of the high-voltage side and the low-voltage side electric conductors are sealed by the sealing material in the fourth step, to thereby form the power converting circuit.

3. The method for manufacturing the electronic apparatus according to claim 1, wherein
- in the third step, the initial gap is reduced to the smaller gap, which is smaller than a thickness of the high-voltage side and the low-voltage side electric conductors.

4. The method for manufacturing the electronic apparatus according to claim 1, wherein
- in the third step, the portion of the connecting portion is deformed in a deforming direction, which is inclined by an angle less than 90 degrees with respect to the opposing direction of the high-voltage side and the low-voltage side electric conductors.

5. The method for manufacturing the electronic apparatus according to claim 1, wherein
- in the third step, the portion of the connecting portion is deformed in such a way that at least one of the high-voltage side and the low-voltage side electric conductors is relatively moved in a direction closer to the other electric conductor on the same plane.

6. The method for manufacturing the electronic apparatus according to claim 1, wherein
- in the third step, the portion of the connecting portion is deformed in such a way that the low-voltage side electric conductor is displaced at a different level from that of the high-voltage side electric conductor.

7. The method for manufacturing the electronic apparatus according to claim 1, wherein
- in the fourth step, the portions of the high-voltage side and the low-voltage side electric conductors are sealed by the sealing material, except for the portion of the connecting portion which is deformed in the third step.

8. The method for manufacturing the electronic apparatus according to claim 1, wherein
- in the second step, a cut-out portion is formed in the high-voltage side and/or the low-voltage side electric conductor at its side end, and
- in the third step, the portion of the connecting portion is deformed in a condition that a jig is inserted into a space formed by the cut-out portion so as to restrict a relative movement of the low-voltage side electric conductor in the opposing direction toward the high-voltage side electric conductor.

9. The method for manufacturing the electronic apparatus according to claim 1, wherein
- in the second step, a power-supply wiring pattern and a ground wiring pattern are formed so that they are arranged in parallel to each other across another initial gap, wherein the high-voltage side electric conductor is connected to the power-supply wiring pattern, while the low-voltage side electric conductor is connected to the ground wiring pattern, and wherein the power-supply wiring pattern and the ground wiring pattern are connected to each other via other connecting portions, and
- in the third step, portions of the other connecting portions are deformed so as to reduce the other initial gap to another smaller gap.

10. The method for manufacturing the electronic apparatus according to claim 1, wherein
- the electronic apparatus is composed of multiple high-voltage side electric conductors, multiple high-voltage side switching devices each of which is mounted to a corresponding high-voltage side electric conductor, multiple low-voltage side electric conductors, and multiple low-voltage side switching devices each of which is mounted to a corresponding low-voltage side electric conductor,
- the multiple high-voltage side switching devices and the multiple low-voltage side switching devices form multiple power converting circuits,
- the high-voltage side switching device and the low-voltage side switching device are connected in series in each of the power converting circuits, and
- the high-voltage side electric conductor and the low-voltage side electric conductor in each of the power converting circuits are arranged in parallel to each other, and
- wherein the method for manufacturing the electronic apparatus further comprises a mounting step, after the third step, for mounting each of the high-voltage side switching devices to the corresponding high-voltage side electric conductor and mounting each of the low-voltage side switching devices to the corresponding low-voltage side electric conductor, and wherein the connecting portions are cut away in the fifth step after the portions of the high-voltage side and the low-voltage side electric conductors are sealed by the sealing material in the fourth step, to thereby form the power converting circuits.

* * * * *